United States Patent [19]

Conte

[11] Patent Number: 5,121,293
[45] Date of Patent: Jun. 9, 1992

[54] METHOD AND APPARATUS FOR INTERCONNECTING DEVICES USING TAB IN BOARD TECHNOLOGY

[75] Inventor: Alfred S. Conte, Hollister, Calif.

[73] Assignee: Sun Microsystems, Inc., Mountain View, Calif.

[21] Appl. No.: 742,294

[22] Filed: Aug. 8, 1991

[51] Int. Cl.$^5$ ............................................... H05K 7/20
[52] U.S. Cl. ...................................... 361/386; 29/738; 174/254; 357/81; 361/398; 361/401
[58] Field of Search ................ 165/80.3, 185; 357/70, 357/80, 81; 439/68, 70, 71, 77; 361/383, 386–389, 398, 400, 401, 403, 405, 406, 414, 421; 174/52.4, 254, 260, 16.3; 29/738–741; 428/901; 437/209, 218–220

[56] References Cited

U.S. PATENT DOCUMENTS

| | | | |
|---|---|---|---|
| 4,729,060 | 3/1988 | Yamamoto | 361/385 |
| 4,814,855 | 3/1989 | Hodgson et al. | 174/52.4 |
| 4,829,405 | 3/1989 | Snyder | 361/413 |
| 4,890,194 | 12/1989 | Derryberry | 361/386 |
| 4,912,547 | 3/1990 | Bilowith et al. | 357/80 |
| 4,931,908 | 6/1990 | Bouchard | 361/395 |
| 4,939,570 | 7/1990 | Bickford et al. | 357/81 |
| 4,985,749 | 1/1991 | Berneut | 357/70 |
| 5,010,387 | 4/1991 | Dunaway | 357/70 |
| 5,053,922 | 10/1991 | Matta | 361/386 |
| 5,072,283 | 12/1991 | Bolger | 357/72 |

OTHER PUBLICATIONS

Marce Eleccion, *Electronics*, "What's New In Packaging? Tape-Automated Bonding Pushes in New Directions", Sep. 3, 1987 pp. 2–5.
IBM Technical Disclosure Bulletin, vol. 31, No. 6, Nov. 1988.

*Primary Examiner*—Gerald P. Tolin
*Attorney, Agent, or Firm*—Blakely Sokoloff Taylor & Zafman

[57] ABSTRACT

A Tape Automated Bonding (TAB) process prepared multi-chip module (MCM) has semiconductor dice embedded into the substrate of the MCM through its top face. A heatsink, which in a preferred embodiment is a copper slug, is emplaced into the underside of the substrate so that the bottom surfaces of the dice engage the heatsink. A compliant, heat-conducting thermoplastic material is used to secure the dice to the heatsink and to maintain a good heat flow path. According to the present invention, the TAB formed component has beam leads that do not require bending to facilitate assembly. Rather, the beam leads are trimmed to length, leaving straight outer beam leads that, after the die is installed in the substrate, extend parallel to and overlie the top face of the substrate. The beam leads are thus positioned for convenient bonding to signal paths laid out on the top face of the substrate.

8 Claims, 2 Drawing Sheets

METHOD AND APPARATUS FOR INTERCONNECTING DEVICES USING TAB IN BOARD TECHNOLOGY

BACKGROUND OF THE INVENTION

1. Field of the Invention

The present invention relates to packaging of electronic components using Tape Automated Bonding (TAB) techniques. More specifically, the present invention relates to TAB In Board (i.e., TIB) packaging wherein TAB processed semiconductor dice are embedded into a packaging substrate of a multi-chip module (MCM), which is cooled by a heatsink.

2. Description of the Prior Art and Related Information

For many years, semiconductor devices like integrated circuits were connected to the outside world by small wires with diameters the size of a human hair. Needless to say, this interconnection procedure was difficult and required sophisticated manufacturing hardware to automate. Also, as lead counts increased, wire bonding became extremely labor-intensive. That increased the assembly costs as well as the risk of device malfunctions due to faulty connections from human error.

Furthermore, as higher speed circuits required more interconnects and as the surface area of VLSI circuits got smaller, assembly limitations of wire interconnects became apparent. With lead counts of some devices surpassing 300, such space restrictions were well beyond the capabilities of conventional wire bonding processes.

Fortunately, with the advent of Tape Automated Bonding (TAB) packaging techniques, the opportunities for automated assembly of interconnects for semiconductor devices improved dramatically.

TAB technology was explored by General Electric back in 1972. It could easily be adapted to relatively small, multileaded packages with interconnects that could be handled by automated bonding machines Indeed, TAB technology is now shifting toward the area of multi-chip TAB, wherein modules that pack several densely leaded chips into a small area. TAB technology also facilitates multilayer substrate configurations.

Although there are many variations, the typical TAB packaging process involves the following steps. A strip of polyimide film ranging from 35 to 105 millimeters wide is needed to begin the process. The polyimide film resembles photographic film and is commercially identified under the trade names Tedlar, Kapton, or Mylar. The film, called the carrier tape, has a number of openings or windows formed along its length. Sprocket holes are evenly spaced along the edges as in conventional photographic film.

A thin foil of electrically conductive metal is laminated to the surface of the carrier tape. The metallic foil is usually a copper based material, made very thin, typically 0.5 to 3 mils in, thickness. Through a photoresist or photolithographic process, the metal foil is etched away to form cantilevered leads, more commonly known beam leads. An opening provided in the metal foil nearly coinciding with the openings in the carrier tape allow a semiconductor chip or die to pass therethrough. Since the beam leads overlie the opening, they are situated for electrical connection to the semiconductor chip when the latter is inserted through the opening. The semiconductor chip has bonding pads positioned on its surface to align with the beam leads. A thermocompression bonding process is then used to attach the beam leads to the semiconductor chip. As is well known, thermocompression involves using a thermode or heated platen to compress the beam lead against the pad to form a bond.

Importantly, the beam leads can be bonded on both ends so that the opposite ends of the leads can extend over other windows or openings in the carrier tape such that these leads can be joined to other chips, a packaging chip carrier, or a substrate. In other words, the inner beam leads are attached to the die (called Inner lead Bonding or ILB) and the outer leads can be attached to the package or other devices (called Outer Lead Bonding or OLB). For mass production with automation, the sprocket holes along the edge of the carrier tape permit incremental feeding of the tape past a number of operating stations, one of which gang bonds all of the leads by thermocompression in one stroke.

After the bonds are formed, it is common to encapsulate the interconnections on the semiconductor chip by coating the structure with a polymeric material. The polymeric material hardens in place and gives strength to the interconnections.

But TAB packaging technology still has many limitations. One such limitation appears when TAB packaging is used in conjunction with multi-chip module or MCM technology. In general terms, MCM is a technique whereby several dice are bonded to a silicon substrate. The interconnects between each die can be achieved with lithographic processes or by TAB technology.

In one field of application, PC workstations, it is well understood that MCM technology is becoming a requirement for pushing the capabilities of processing data to higher levels. By reducing the distances between ICs, it is possible to increase IC performance, and as a by-product, conserve precious board space.

Various MCM technologies exist currently. They range from basic FR4 Sister Boards with ICs on them to exotic, silicon-substrate-based modules.

MCM does have its share of problems, however. For example, one issue to contend with is when one acquires multiple ICs from different companies to build a specific MCM, only to find that the various firms do not wish their wafer-specific data known by anyone who would be considered a competitor.

Another issue concerns thermal management. When industry requirements push silicon ICs to faster and faster speeds, more energy is normally required. Aggravating the thermal management problem is the common practice of closely packing ICs together to maximize board space utilization, thus creating even more heat build-up.

Another issue is that of reworkability. When one examines the aggregate yields of, for example, a typical five-chip MCM, one sees that a certain number of MCMs require some repair or rework. But if an MCM is not easily repairable, then a great amount of revenue is lost due to ICs that cannot be recovered from that MCM.

Still another very important concern for MCMs is testability. The MCM user must be able to pre-test his devices before MCM assembly can occur so that a reasonable module yield can be obtained. Too much material cost as well as assembly cost are lost after the fact when MCM pre-testing is not available.

One final MCM concern is flexible manufacturability. That is, the capability of having anyone produce an MCM for a firm without having to rely on high-cost IC fabrication environments that cannot be duplicated without massive amounts of capital investment.

As is apparent at this point, a need exists in MCM technology that addresses all of the foregoing concerns. Accordingly, it is an object of the present invention to improve MCM technology using existing current interconnect technologies that are available to anyone. It is another object of the present invention to ensure that chip-to-chip spacing is extremely close, resulting in good signal speeds and excellent board area conservation. It is yet another object of the present invention to provide component pretestability that is easily achieved without exotic hardware. Other objects of the present invention include managing thermal build-up in the package; achieving an intermix capability of different IC vendor chips; simplifying in-house assembly of the MCMs; and reworking of defective MCMs with existing tooling.

SUMMARY OF THE INVENTION

The present invention relates to TAB in board packaging having a heatsink adapted to the package for cooling purposes. According to the present invention, several semiconductor chips are housed inside an MCM packaging substrate made of a polyimide or ceramic material. The interconnects between IC chips or dice are formed by TAB techniques known in the art. Unlike conventional TAB techniques, however, the present invention provides that the outer beam leads need not be bent. In fact, the leads remain straight, nearly parallel to the top face of the MCM substrate when the dice are installed.

To keep the beam leads relatively straight, the present invention provides that the die be recessed into the MCM packaging substrate. For that purpose, the packaging substrate has a cut-out or cavity coinciding with the shape of the die. The die is then lowered into this cavity so that its top surface is substantially flush with the top face of the packaging substrate. In this particular orientation, the outstretched outer beam leads overlie the top face of the substrate.

In all other respects, the remaining interconnections are conventional. Signal, power, and ground inner beam leads extending from the die have already been formed by conventional TAB technology. The outer beam leads are then bonded to prearranged signal paths formed on the packaging substrate, which signal paths connect with pins that reach out to the exterior of the packaging substrate.

For cooling purposes, the present invention provides a heatsink such as a copper slug that is embedded into the bottom face of the packaging substrate. Before die installation, the heatsink is inserted up into a recess located in the underside of the substrate and kept in place by a friction fit between the recess and the heatsink. Thereafter, the dice are lowered into their respective cavities from the top face of the substrate. Since the cavities are in communication with the recess, the bottom of the die can be lowered to a depth when it engages the top of the heatsink.

Any bonding or joining processes known in the art can be used to attach the die to the heatsink and form a thermal junction In a preferred embodiment of the present invention, however, a compliant thermal conduit (CTC) thermal joining process is used to bond the die to the heatsink. This process is disclosed in co-pending U.S. patent application Ser. No. 07/589,094. Briefly, the process involves injecting a compliant, heat-conducting thermoplastic material into the joint. The material cures and forms a flexible bond that is also conducive to heat transfer.

Primarily through conduction, the heat generated by the die during operation passes through the thermal junction into the heatsink, which transfers the heat into the ambient atmosphere. In addition, when the MCM is assembled to the motherboard, the packaging substrate is inverted Once inverted after installation, the underside of the packaging substrate faces up and consequently, so does the heatsink. Hence, the inverter position clearly is conducive to convective heat flow away from the heatsink.

Therefore, the present invention has many advances over the prior art. First, it is possible to isolate the chip vendor so that it need not deliver a product finished to wafer level; the vendor should then not be concerned with divulging proprietary secrets involving its chips. Second, having individual TAB components in tape carriers facilitates pre-testability. Third, if TAB packaging is used as in the preferred embodiment, rework of defective chips can be done easily. Fourth, manufacturing flexibility is possible since basically the same substrate can be used for many different product designs and environments. Indeed, the present invention can be modified for use with multiple window TAB packages. Fifth, the heatsink is easily adaptable to many cooling configurations when extremely high power dissipation is necessary. Finally, the present invention also permits stacking of the packaging substrates so that Multiple Package capabilities are possible. As a result, the MCM can expand as the user's requirements grow to maximize its hardware purchase.

DETAILED DESCRIPTION OF THE INVENTION

In the following description, numerous details such as specific materials and configurations are set forth in order to provide a more complete understanding of the present invention. But it is understood by those skilled in the art that the present invention can be practiced without those specific details. In other instances, well-known elements are not described explicitly so as not to obscure the present invention.

The present invention relates to an apparatus and process for using Tape Automated Bonding (TAB) techniques to prepare semiconductor IC chips that are eventually embedded into cavities of a multi-chip module (MCM) packaging substrate. In a preferred embodiment, the cavities are in communication with a heatsink that is inserted into a recess located in the underside of the substrate. Thus, when the chips are lowered into the cavities, their bottom surfaces engage the heatsink. In this manner, heat transfer from the chips is efficient, and effective cooling of the MCM is possible. This technique has been coined with the acronym TIB, which stands for TAB In Board.

Figure 1:
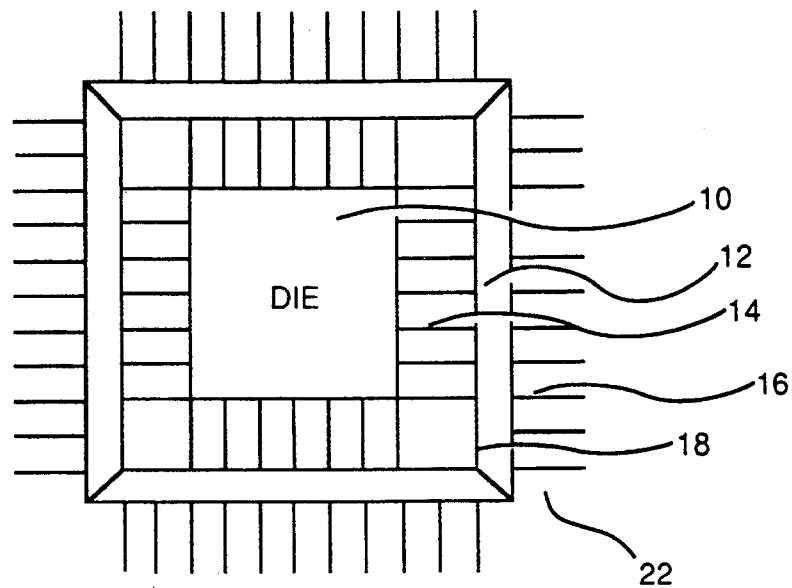
FIG. 1 is a plan view of a die with outer and inner beam leads formed by a TAB process.

In the preferred embodiment, the present invention provides an IC chip or die 10 as shown in a plan view in FIG. 1. Through a TAB procedure known in the art, inner beam leads 14 and outer beam leads 16 are formed from the TAB polyimide carrier tape or film. According to the TAB process, an opening or window 18 is cut into the carrier tape so that the die 10 can pass through. Subsequent to formation of the window 18 and the beam leads 14 and 16, some carrier tape is left over. This surplus tape is called the tape body 12.

After the die 10 is inserted through the window 18, the inner beam leads 14 are thermocompression bonded to electrical contact pads (not shown) located on the top of the die 10. So in this configuration, the inner beam leads 14 connect with the die 10 while the outer beam leads 16 connect with other devices. Signal paths (not shown) are provided on the surface of the tape body 12 when necessary to interconnect specific inner beam leads 14 with specific outer beam leads 16. Taken collectively, the die 10, the tape body 12, and the beam leads 14, 16 are loosely termed the TAB component 22.

It is important to pause and note here that the present invention, by utilizing individual TAB components in carriers, achieves pre-testability of components before assembly. Also by using TAB as the preferred interconnect, the present invention solves the MCM rework issue.

Figure 2A:
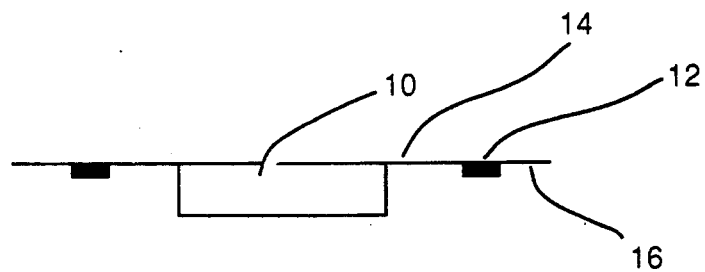
FIG. 2(a) is a side view of the die shown in FIG. 1 produced according to the present invention with the outer beam leads extending parallel to the top surface of the die.

A unique aspect of the present invention is in the trimmed-out TAB component 22. According to the present invention, there is no mechanical shaping of the beam leads 14 and 16. As is shown in FIG. 2(a), the outer beam leads 16 are trimmed horizontally without need for bending. This reduces the lead length to an absolute minimum for a TAB chip on tape package.

Figure 2B:
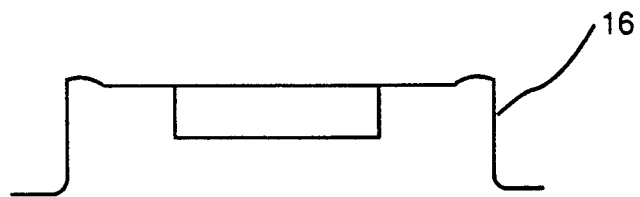
FIG. 2(b) is a side view of a prior art die wherein the TAB beam leads are bent to facilitate assembly.

By contrast, a prior art TAB component, shown in FIG. 2(b), requires bending or crimping the outer beam leads to facilitate assembly to the packaging substrate. But bending induces mechanical stresses into the delicate leads thus increasing the risk of breakage or impairing lead conductivity.

Figure 3:
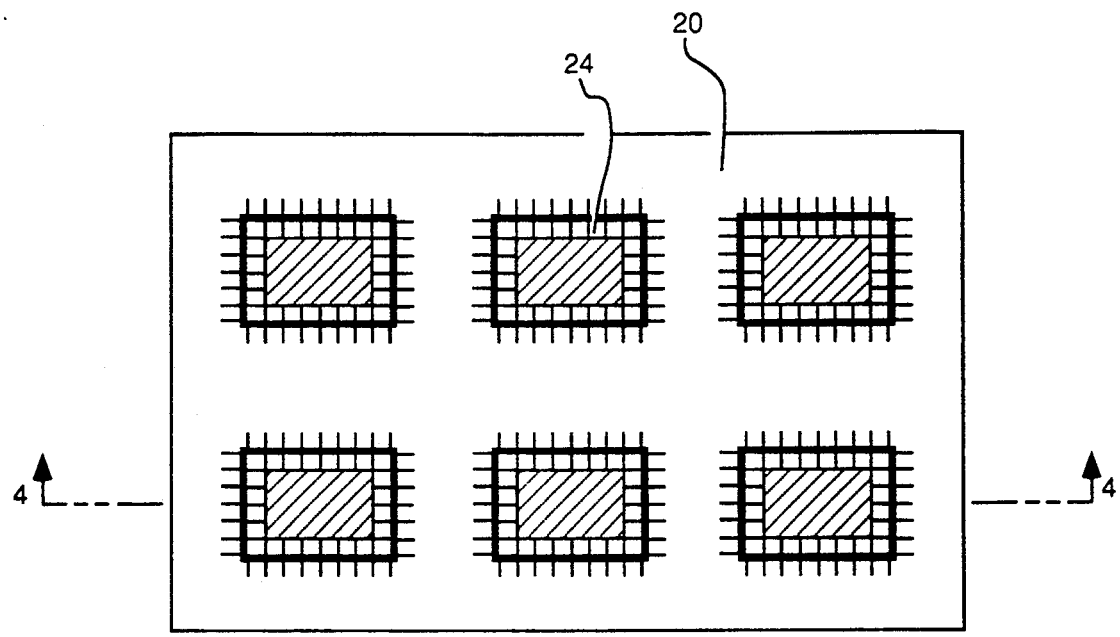
FIG. 3 is a plan view of the present invention multichip module with the TAB packaged dice embedded in the cavities of a packaging substrate.
Figure 4:
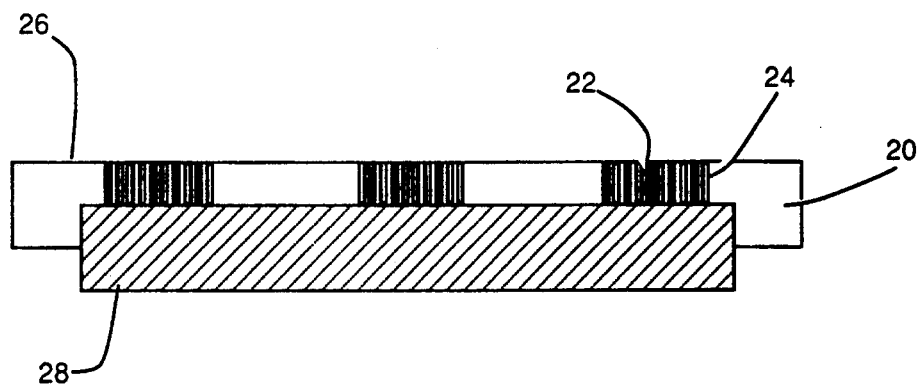
FIG. 4 is a sectional view of the multi-chip module of FIG. 3 taken along line 4—4 to reveal the contact between the dice and the heatsink.

According to the present invention, after the TAB component 22 has been excised, it is installed into a packaging substrate 20, illustrated in a plan view in FIG. 3. FIG. 4 presents a sectional view taken along line 4—4 of FIG. 3. It is apparent here that the TAB component 22 is not simply placed on top of the substrate 20; rather, the TAB component 22 is embedded into the substrate 20. For each die 10 installed, the substrate 20 has a well or cavity 24 that holds a specific chip 10 therein. Laid into the surface of the substrate 20 are signal paths (not shown). Consequently, when the IC chip 10 is lowered into the cavity 24, its outer beam leads 16 can be bonded to these signal paths, or they can be connected to other devices. The signal paths connect the chips 10 with the outside world and function conventionally as a signal or power conductor, or as a ground.

As illustrated in the cross-sectional view in FIG. 4, the significance of straight leads can be seen. Each TAB component 22 is lowered into the cavity 24 to a depth where the top surface of the TAB component 22 stands nearly flush with the top face 26 of the substrate 20. The outer beam leads 16 reach outward, parallel to and overlying the top face 26 for connection with the signal paths. Therefore, these straight outer beam leads 16 permit easy and convenient bonding to the multi-chip module substrate 20.

Of course the outer and inner beam leads 16 and 14 need not be configured as shown in FIG. 1. A person skilled in the art can easily devise other beam lead designs to match the particular purpose. Furthermore, arrangement of the TAB components 22 in the multi-chip module substrate 20 can be altered to satisfy design needs that depart from the six-chip layout shown in FIG. 3.

Each cavity 24 is a passage that leads vertically through the substrate 20 into a heatsink 28. In actual assembly steps, the heatsink 28 is installed in the substrate 20 before the TAB components 22. The heatsink 28 is incorporated into a recess in the bottom of the substrate 20, as is shown in FIG. 4. Typically, the heatsink 28 is forced fit into the recess. Thus, the interference fit between the two structures prevents unexpected disassembly.

The heatsink 28 in a preferred embodiment is made from a copper slug. Copper is a good thermal conductor and its large surface area, exposed to the air under the substrate 20, is good for radiating heat. Other thermal conducting materials known in the art are suitable. Also, the heatsink 28 can be either drilled and tapped for fitment with other cooling devices known in the art. It is also possible to mount a threaded post on the heatsink 28. This type of direct die to heatsink contact is unique to MCM approaches. It allows a very efficient thermal path to remove heat build-up. If additional cooling is required, it is very easily managed by adding another heatsink or heat pipe to the heatsink already built in the substrate.

The heat comes from the dice 10 when they are powered up for heavy use. Consequently, the interface between the dice 10 and the heatsink 28 is critical for proper cooling. A poor connection between the bottom of the dice 10 and the top surface of the heatsink 28 impedes heat transfer out of the dice 10.

A special process is necessary to ensure proper heat flow. The present invention provides that the thermal junction between each die 10 and the heatsink 28 be formed by a process called Compliant Thermal Conduit For Printed Circuit Boards, which is disclosed in co-pending U.S. application Ser. No. 07/589,094, filed Sept. 27, 1990, assigned to Sun Microsystems, Inc.

Briefly, this die attach process involves applying a quantity of heat conductive thermoplastic material to join the die 10 to the heatsink 28. At first, the thermoplastic material is fluid and flows to fill in any voids in the joint. After curing, the bond stiffens insofar as no further flow occurs, but the joint remains flexible.

In a preferred embodiment, the thermoplastic material should be hexagonal boron nitride; other materials known in the art such as caulk or RTV are suitable. Importantly, the compliant nature of the thermoplastic material maintains a solid thermal bond even when the substrate 20 undergoes flexing during assembly. Another benefit is that a thermal joint produced by this process remains free from voids that might impair the thermal transfer rate between the die 10 and the substrate 20.

In an alternate embodiment (not shown), the present invention provides that the packaging substrate be stacked onto other substrates prepared in a similar manner. Blind vias are formed in the substrates to interconnect them vertically. Moreover, by alternating every 180 degrees for the electrical contacts, it is possible to slip in cooling devices that radiate out to the sides of the multi-chip module to manage heat build-up.

The present invention easily adapts to a Land Grid Array interconnect approach to the motherboard, known in the art. In the present invention, the contacts to the motherboard are on the same side as the TAB components 22. After MCM assembly, the substrate 20 is inverted during installation to the motherboard. This exposes the backside (i.e., bottom surface) of the heatsink 28 in the MCM so that its orientation facilitates a correct thermal path upward for the heat to flow.

This also protects the TAB IC's from any potential handling damage. If additional cooling is required, the assembly allows a generous choice in cooling techniques to be attached to the exposed heatsink.

In summary, the present invention provides an MCM approach which can be utilized nicely with multiple window TAB carrier tapes. That is, the TAB carrier tape can be made with multiple IC chips being installed. This technique is useful in attaining very close coupling between two IC chips that need the minimum signal path distance. The present invention allows this form of tape design to be employed while still allowing rework and providing good thermal management.

What is claimed is:

1. A multi-chip module comprising:
    a packaging substrate having top and bottom faces wherein a plurality of cavities are disposed into the top face of the substrate;
    thermal conduction means embedded into the bottom face of the substrate such that a top surface of the thermal conduction means is in communication with the cavities;
    a plurality of semiconductor chips each having top and bottom surfaces wherein the top surface has electrical contacts, and wherein the plurality of chips are disposed inside the cavities such that each bottom surface engages the top surface of the thermal conduction means and each top surface is substantially flush with the top face of the packaging substrate;
    a flexible dielectric film having top and bottom surfaces and a plurality of openings therein, wherein the top surface is provided with a plurality of beam leads formed thereon and projecting coplanar with the top face of the substrate inward into the openings and outward away from the openings at a perimeter of the film, and wherein the flexible dielectric film is mounted to the top face of the substrate in such alignment that the chips protrude through the openings and the beam leads can be connected to the electrical contacts; and
    interconnect means disposed on the substrate for connecting the beam leads to an external signal, power or ground source.

2. The multi-chip module of claim 1, wherein the chips are bonded to the thermal conduction means by use of a compliant, heat-conducting thermoplastic material.

3. The multi-chip module of claim 2, wherein the substrate is made from a ceramic material.

4. The multi-chip module of claim 2, wherein the substrate is made from a polyimide material.

5. The multi-chip module of claim 2, wherein the film is made from a polyimide material.

6. The multi-chip module of claim 2, wherein the thermal conduction means is a copper slug.

7. The multi-chip module of claim 2, wherein the compliant heat-conducting thermoplastic material is hexagonal boron nitride.

8. A method for producing a multi-chip module comprising the steps of:
    providing a substrate having top and bottom faces, a plurality of cavities disposed in the top face, and signal paths disposed on the top face;
    embedding a thermal conduction means having top and bottom surfaces into the bottom face of the substrate such that the top surface of the thermal conduction means is in communication with the cavities;
    providing a plurality of semiconductor chips having top and bottom surfaces wherein the top surfaces include electrical contacts;
    laminating onto the top surfaces of the chips a flexible dielectric film having beam leads formed thereon and openings formed therein such that the beam leads project inward into the openings and outward away from the openings at a perimeter of the film, and wherein the chips pass through the openings;
    bonding the beam leads to the electrical contacts on the top surfaces of the chips;
    inserting the chips into the cavities of the substrate such that the bottom surfaces of the chips engage the top surface of the thermal conduction means and the beam leads are coplanar with the top face of the substrate;
    bonding the bottom surfaces of the chips to the top surface of the thermal conduction means by applying a compliant, heat-conducting thermoplastic material therebetween and allowing the thermoplastic material to cure; and
    bonding the beam leads to the signal paths on the substrate.

* * * * *